(12) United States Patent
Goodlin et al.

(10) Patent No.: US 8,551,890 B2
(45) Date of Patent: Oct. 8, 2013

(54) SHOWERHEAD FOR CVD DEPOSITIONS

(75) Inventors: Brian E. Goodlin, Plano, TX (US); Qidu Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 39 days.

(21) Appl. No.: 13/346,603

(22) Filed: Jan. 9, 2012

(65) Prior Publication Data

US 2012/0108076 A1  May 3, 2012

Related U.S. Application Data

(62) Division of application No. 13/025,035, filed on Feb. 10, 2011.

(60) Provisional application No. 61/325,793, filed on Apr. 19, 2010.

(51) Int. Cl.
*H01L 21/31* (2006.01)

(52) U.S. Cl.
USPC ........... 438/758; 438/680; 438/681; 257/761; 257/763; 257/764; 257/770; 257/1; 257/E21.011; 156/245.33; 156/345.34; 137/1; 118/715; 118/723 VE; 118/723 R; 118/723 E; 118/724; 118/732

(58) Field of Classification Search
None
See application file for complete search history.

(56) References Cited

U.S. PATENT DOCUMENTS

| | | | | |
|---|---|---|---|---|
| 5,950,925 A | * | 9/1999 | Fukunaga et al. | 239/132.3 |
| 5,976,261 A | * | 11/1999 | Moslehi et al. | 118/719 |
| 6,821,910 B2 | | 11/2004 | Adomaitis et al. | |
| 2009/0162262 A1 | * | 6/2009 | Bera et al. | 422/186.04 |
| 2009/0218317 A1 | * | 9/2009 | Belen et al. | 216/67 |

* cited by examiner

*Primary Examiner* — Yasser Abdelaziez
(74) *Attorney, Agent, or Firm* — Rose Alyssa Keagy; Wade J. Brady, III; Frederick J. Telecky, Jr.

(57) ABSTRACT

A CVD showerhead that includes a circular inner showerhead and at least one outer ring showerhead. At least two process gas delivery tubes are coupled to each showerhead. Also, a dual showerhead that includes a circular inner showerhead and at least one outer ring showerhead where each showerhead is coupled to oxygen plus a gas mixture of lead, zirconium, and titanium organometallics. A method of depositing a CVD thin film on a wafer. Also, a method of depositing a PZT thin film on a wafer.

9 Claims, 6 Drawing Sheets

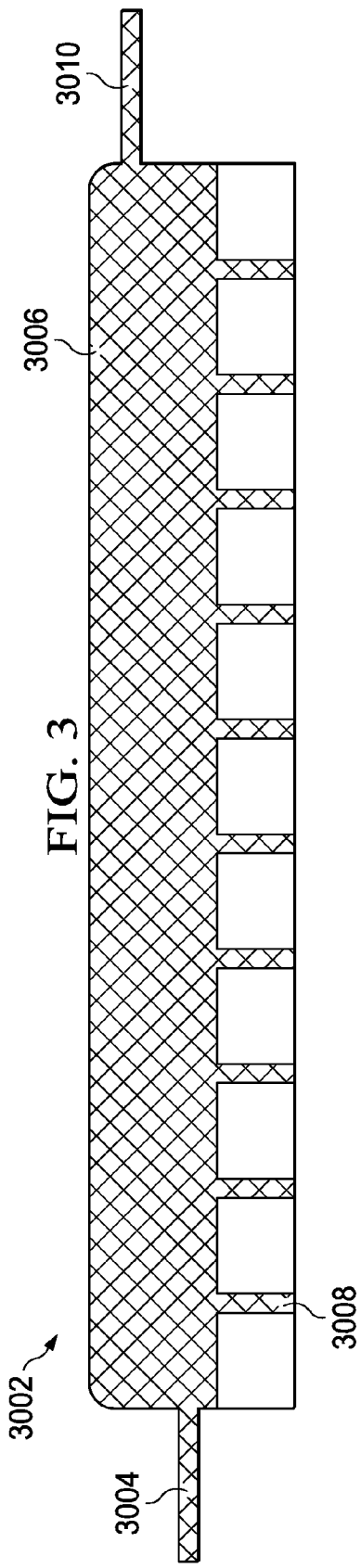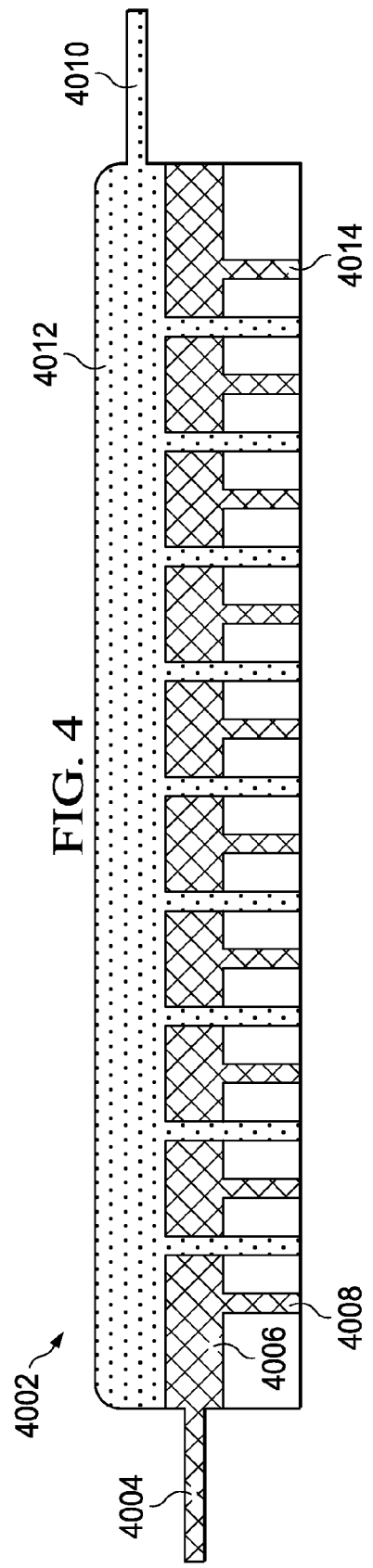

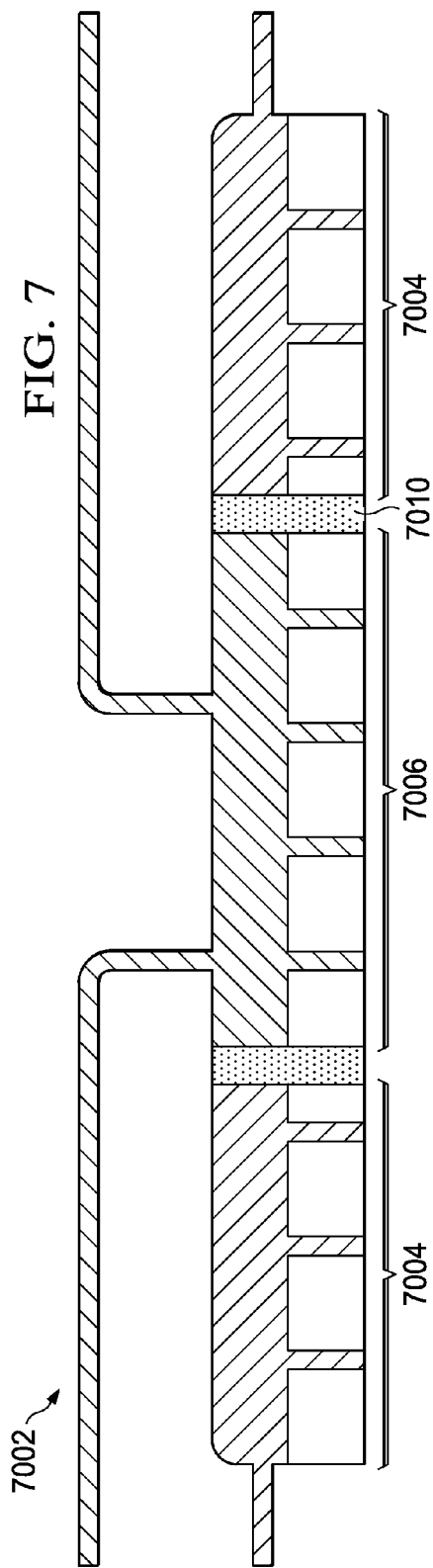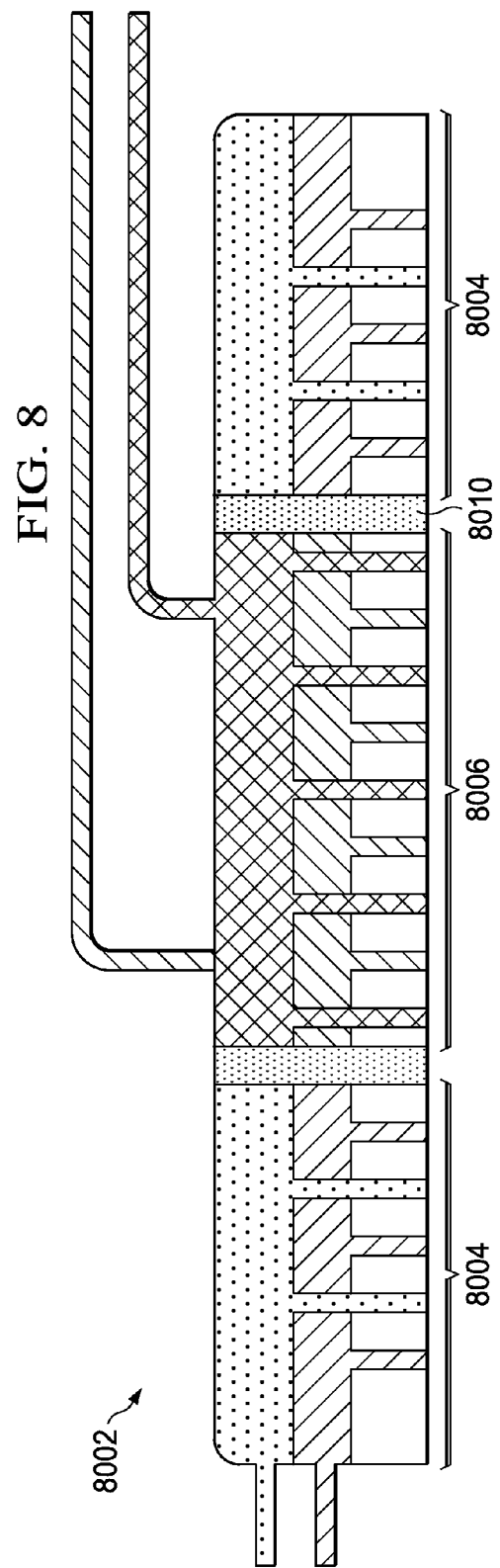

SHOWERHEAD FOR CVD DEPOSITIONS

This is a divisional of U.S. application Ser. No. 13/025,035, filed Feb. 10, 2011, which claims the benefit of U.S. Provisional Application 61/325,793, filed Apr. 19, 2010), the contents of both are incorporated by reference.

FIELD OF THE INVENTION

This invention relates to single-wafer processes involving the production of semiconductor devices. More particularly this invention relates to chemical vapor deposition (CVD) processes and equipment.

DESCRIPTION OF THE VIEWS OF THE DRAWING

FIG. 3 is a cross-section of a chamber showerhead.
FIG. 4 is a cross-section of a dual chamber showerhead.
FIG. 7 is a cross-section of a separated dual showerhead.
FIG. 8 is a cross-section of a separated dual split showerhead.

DETAILED DESCRIPTION

Figure 1:
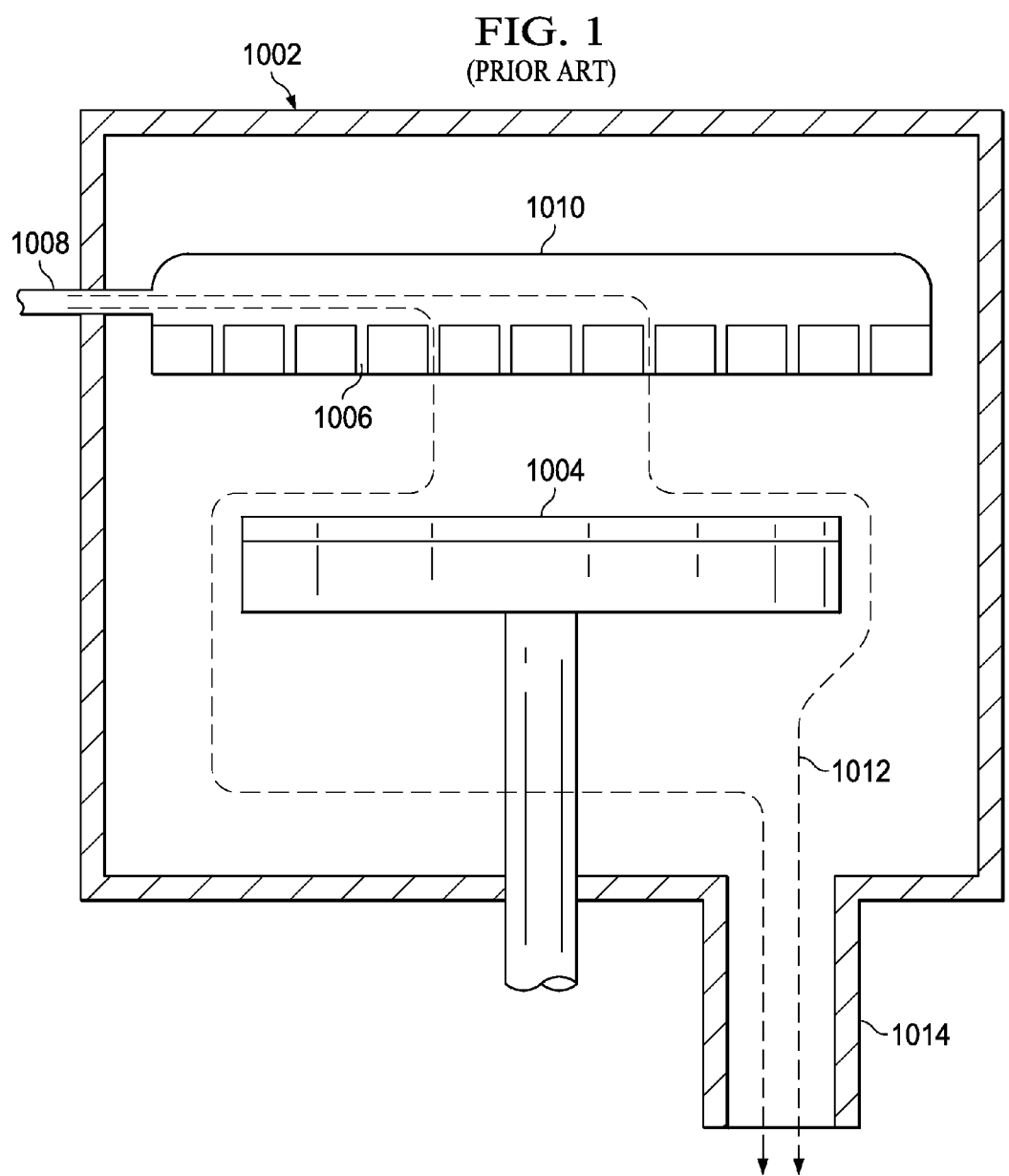
FIG. 1 (Prior art) is a cross-section of a CVD process chamber.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

The term "non-reacting process gas mixture" refers to a mixture of at least more than one non-inert process gases that do not react with each other when mixed together. For example, a lead organometallic process gas may be mixed with a zirconium organometallic process gas—with no chemical reaction occurring. Likewise silane process gas may be mixed with dichlorosilane process gas—with no chemical reaction occurring.

Figure 2:
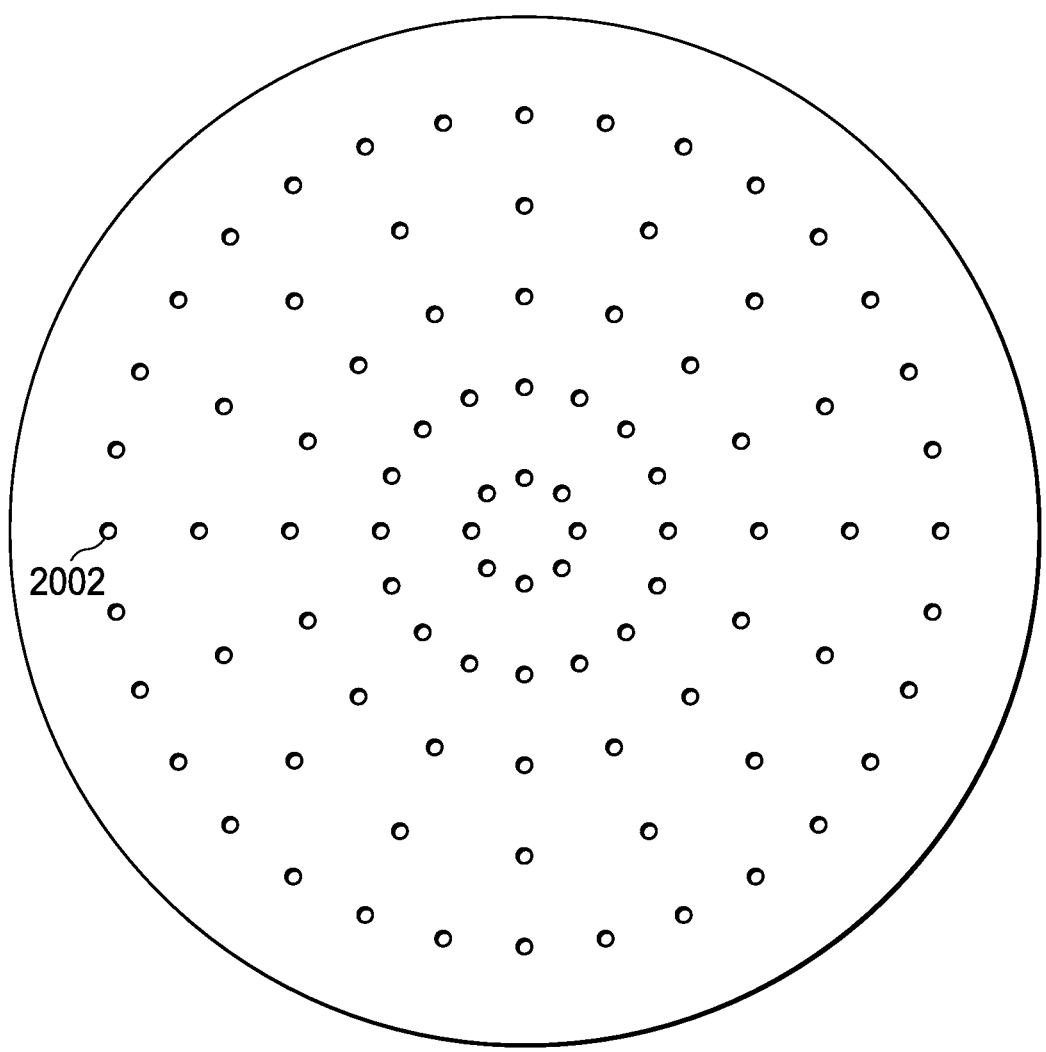
FIG. 2 (Prior art) is top down view of a showerhead.

Most single wafer deposition reactions, including CVD, are activated either thermally or using a plasma. Thin film uniformity depends upon mass transport of the reactants and reaction products over the wafer. As shown in FIG. 1, many single wafer CVD systems are structured to allow the process gasses to be introduced into the CVD chamber 1002 above the wafer 1004 through orifices 1006 in a showerhead 1010. The process gases may enter the showerhead 1010 through gas delivery tube 1008. As shown in FIG. 2, the showerhead orifices 2002 are typically arranged in a radial pattern (to mimic the shape of the wafer 1004). Returning to FIG. 1, the process gases typically flow from the wafer center to the wafer edge as indicated by the broken lines 1012. The process gases are pumped out of the CVD chamber 1002 around the edges of the wafer 1004 through a vacuum port 1014.

In a new embodiment, process gasses may be divided into non-reacting process gas mixtures. As illustrated in FIG. 3, a first of the non-reacting process gas mixtures may be introduced into the showerhead mixing chamber 3006 of the chamber showerhead 3002 through a first process gas delivery tube 3004, and a second non-reacting process gas mixture may be introduced into the showerhead mixing chamber 3006 through a second process gas delivery tube 3010. The first non-reacting gas mixture and the second non-reacting gas mixture may mix within the showerhead mixing chamber 3006 prior to exiting through showerhead orifices 3008 into the CVD deposition chamber. After the process gasses have exit through the showerhead orifices 3008, they will react and deposit a thin film on the semiconductor wafer. In an example embodiment, the first non-reacting gas mixture contains a lead organometallic, a zirconium organometallic, and a titanium organometallic; plus a carrier gas such as helium or argon. The second non-reacting gas mixture may be oxygen plus a carrier gas, or oxygen only. These process gasses are designed to deposit a PZT (lead-zarconium-titaniate) thin film onto the wafer surface. (Note that in the case when the second non-reacting gas mixture is oxygen only, it is not a mixture of more than one gas.)

For some processes, the two non-reacting gas mixtures may begin to react as soon as they come in contact with each other inside the showerhead mixing chamber 3006 prior to exiting through the orifices 3008. If that happens, a thin film deposition may occur within the showerhead mixing chamber 3006 and on the surfaces of the orifices 3008—possibly causing a partial or full blockage of one or more orifices 3008. In addition, unwanted particulates may form and then deposit onto the wafer—possibly causing wafer defects. This problem may be avoided by using a split showerhead as is illustrated in the embodiment in FIG. 4. A first non-reacting process gas mixture may be introduced into the first showerhead chamber 4006 of the dual chamber showerhead 4002 through a first process gas delivery tube 4004, and a second non-reacting process gas mixture may be introduced into the second showerhead chamber 4012 through a second process gas delivery tube 4010. The first non-reacting gas mixture exits through first showerhead orifices 4008 and the second non-reacting gas mixture exits through second showerhead orifices 4014 into the CVD deposition chamber where they mix, react, and deposit a thin film on the semiconductor wafer. In an example embodiment, the first non-reacting gas mixture contains a lead organometallic, a zirconium organometallic, and a titanium organometallic, plus a carrier gas such as helium or argon. The second non-reacting gas mixture contains oxygen plus a carrier gas, or oxygen only. The first non-reacting gas mixture reacts with the second non-reacting gas mixture to deposit a PZT (lead-zarconium-titaniate) thin film onto the wafer. (Again, note that in the case when the second non-reacting gas mixture is oxygen only, it is not a mixture of more than one gas.)

PZT thin films are often used within ferroelectric devices in integrated circuits. To achieve the desired lead content in the PZT thin film, an excess lead reactant is applied. In addition, a temperature tilt (i.e. a temperature gradient) of approximately 10° C. to 30° C. is imposed from wafer center to wafer edge in a typical 200 mm CVD deposition chamber. While this achieves the desired PZT composition and thickness uniformity in the center of the wafer, the lead that is deposited on the chamber walls may desorb. Plus, lead may also desorb from the edges of the wafer (because of the higher temperature at the edges of the wafer). That released lead may react with oxygen in the gaseous phase above the wafer to form unwanted particles. The unwanted lead oxide particles may then deposit on the wafer surface; forming defects in the PZT thin film. Therefore, it is very important, but may be very difficult, to achieve target thin film thickness and/or composition uniformity using conventional single wafer CVD equipment.

Figure 5:
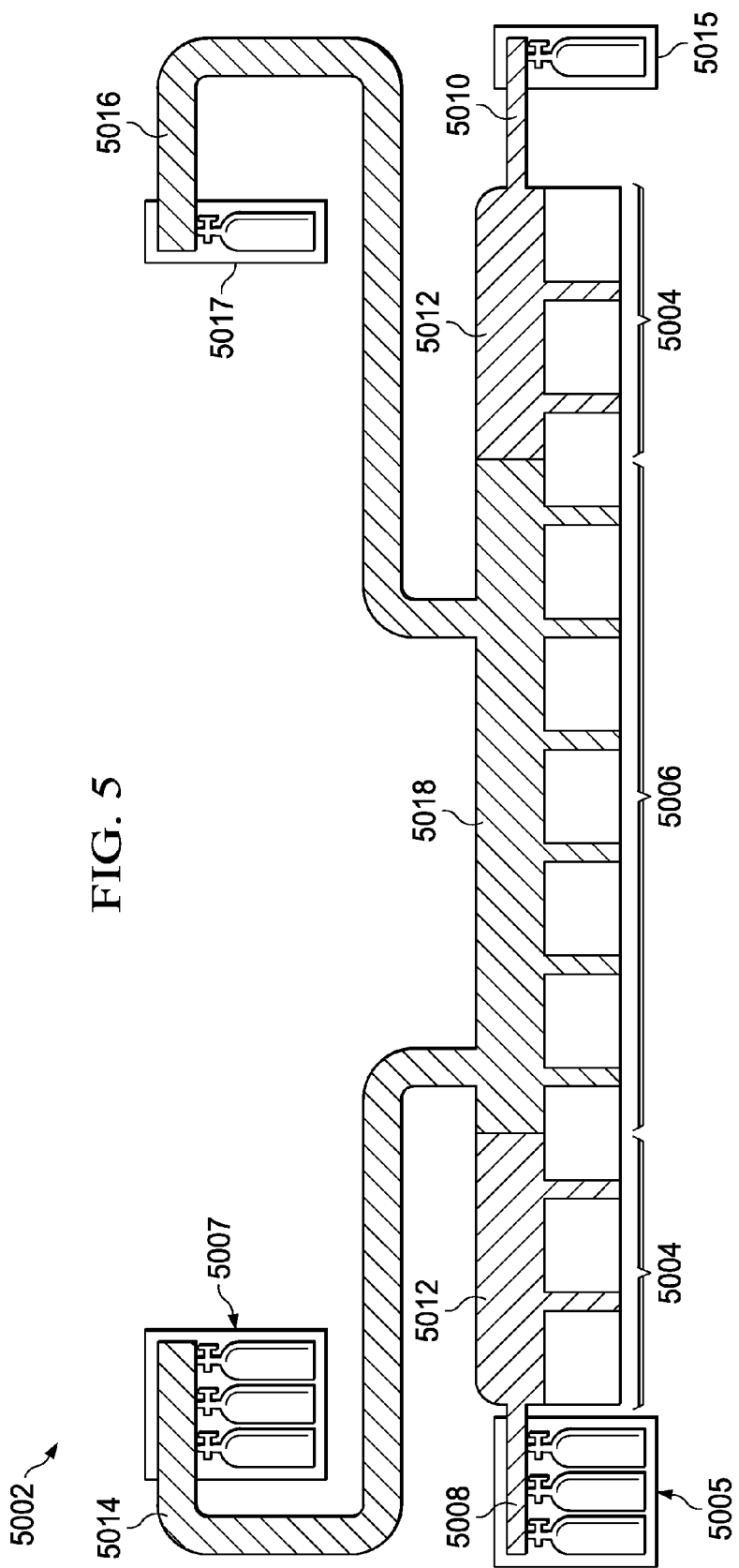
FIG. 5 is a cross-section of a dual showerhead.

In an embodiment shown in FIG. 5, the showerhead is divided radially to form a dual showerhead 5002 that includes a circular inner showerhead 5006 and an outer ring showerhead 5004. To avoid unwanted thin film deposition and particle formation in the process gas delivery tubes, the process gases may be separated into two groups of non-reacting process gas mixtures. For the outer ring showerhead 5004, the first group of non-reacting process gas mixtures may be formed in first and second gas delivery systems, 5005 and 5015. This first group of non-reacting process gas mixtures is delivered to the outer showerhead mixing manifold 5012 through separate first and second process gas delivery tubes 5008 and 5010. For the circular inner showerhead 5006, the second group of non-reacting process gas mixtures may be formed in third and fourth gas delivery systems, 5007 and 5017. This second group of non-reacting process gas mixtures is delivered through separate third and fourth process gas delivery tubes 5014 and 5016 to the inner showerhead mixing manifold 5018. The first group of non-reacting process gas mixtures and the second group of non-reacting process gas mixtures may combine in the outer and inner shower head mixing chambers, 5012 and 5018, prior to exiting through the showerhead orifices. These process gasses then react in the CVD chamber to deposit a thin film on a semiconductor wafer.

In an example embodiment that utilizes the dual showerhead 5002, the first group of non-reacting process gas mixtures includes a lead organometallic, a zirconium organometallic, and a titanium organometallic. In addition, a carrier gas such as helium or argon may be introduced into the inner showerhead mixing manifold 5018 through the third process gas delivery tube 5014 while oxygen (or oxygen plus inert gas mixture) may be delivered to the inner showerhead mixing manifold 5018 through the fourth process gas delivery tube 5016. The second group of non-reacting process gas mixtures includes a lead organometallic, a zirconium organometallic, and a titanium organometallic. In addition, a carrier gas such as helium or argon may be introduced to the outer showerhead mixing manifold 5012 through the first process gas delivery tube 5008 while oxygen (or oxygen plus inert gas mixture) may be delivered to the outer showerhead mixing manifold 5012 through the second process gas delivery tube 5010. The dual showerhead 5002 design enables an organometallic gas mixture with a lower concentration of lead to be introduced to outer showerhead mixing manifold 5012. The lower concentration of lead in the outer showerhead mixing manifold enables a lower temperature tilt to be used from wafer center to wafer edge. This in turn reduces the likelihood of the formation of lead oxide particulates near the wafer edge and thus reduces wafer defects.

In a more detailed embodiment, a first gas mixture with a lead/(zirconium+titanium) ratio in the range of approximately 0.8 to 1.5, and more specifically a ratio of 1.2, may be delivered through the fourth process gas delivery tube 5016 to the circular inner showerhead 5006 while oxygen is provided through the third process gas delivery tube 5014. A second gas mixture with a lead/(zirconium+titanium) also having a ratio in the range of approximately 0.8 to 1.5, and more specifically a ratio of 1.0, may be delivered to the outer ring showerhead 5004 through the second process gas delivery tube 5010 while oxygen is provided through the first process gas delivery tube 5008. This ratio difference facilitates a wafer center-to-edge temperature tilt of less than about 10° C.; therefore, it may deliver the desired center-to-edge composition uniformity and thickness uniformity (with reduced particle formation) across a 200 mm wafer.

Additional concentric showerheads (such as triple or quadruple showerheads) may be used if needed. The additional concentric showerheads may be useful for thin film deposition processes involving larger diameter wafers. Moreover, the additional showerheads may accommodate the use of more than two groups of non-reacting process gas mixtures.

Figure 6:
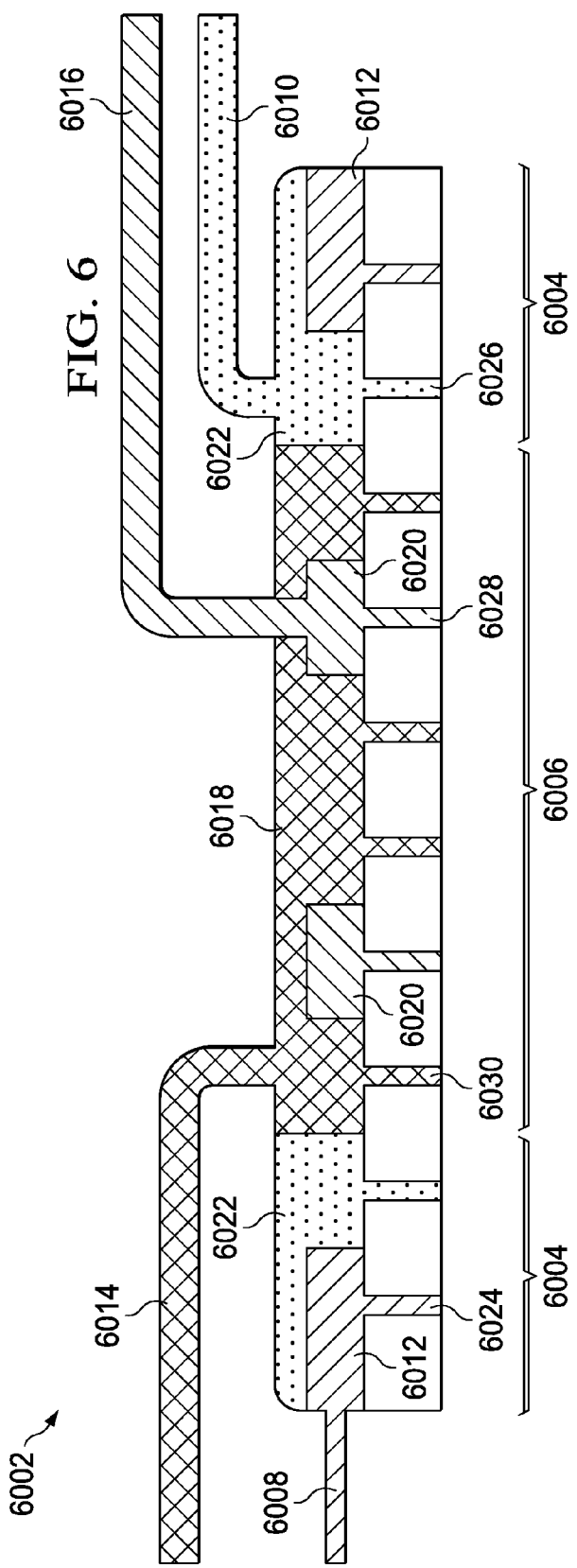
FIG. 6 is a cross-section of a dual split showerhead.

An embodiment that may reduce the formation of particles inside the outer and inner showerhead mixing manifolds 5012 and 5018 (often caused by process gas reaction within the outer and inner showerheads 5004 and 5006, respectively) is illustrated in FIG. 6. In this embodiment, a dual split showerhead 6002 separates the process gasses (that react with each other) until they are introduced into the CVD chamber through separate orifices. For example, a mixture of a lead organometallic process gas, a zirconium organometallic process gas, a titanium organometallic process gas, plus a carrier gas (such as helium or argon) may be provided by a first process gas delivery tube 6014 and flow into the CVD chamber through a first set of orifices 6030 in the circular inner showerhead 6006. A separate second process gas delivery tube 6016 may provide oxygen to the CVD chamber through a separate second set of orifices 6028 in the same circular inner showerhead 6006.

The first gas distribution manifold 6018 is separate from the second gas distribution manifold 6020. (Areas 6020 are different regions of the same gas distribution manifold.) However, the two gas distribution manifolds 6018 and 6020 combine to form the circular inner showerhead 6006.

A different mixture containing different concentrations of a lead organometallic process gas, a zirconium organometallic process gas, a titanium organometallic process gas, and a carrier gas may be introduced through a third process gas delivery tube 6008 to the CVD chamber through a third set of orifices 6024 in the outer ring showerhead 6004. (Note that areas 6012 are different regions of the same third gas distribution manifold. Likewise, areas 6022 are different regions of the same fourth gas distribution manifold.) Together, the third and fourth gas distribution manifolds 6012 and 6022 form the outer ring showerhead 6004. A separate fourth process gas delivery tube 6010 may provide oxygen to the CVD chamber through a separate fourth set of orifices 6026 in the same outer ring showerhead 6004 (at locations that are closer to the orifices for the mixture provided by the third process gas delivery tube 6008).

In the embodiments supra, gasses such as the lead, zirconium, and titanium organometallics may be mixed together prior to delivery to the showerheads because these organometallic reagents do not react with each other. This may reduce the cost of additional tubing and flow meters that are often required when process gases are delivered to the showerhead individually. Furthermore, the dual (or multiple) showerhead embodiments accommodate the delivery of a mixture of process gases to the circular inner showerhead (at the center of the wafer) that has different reactant concentrations than the mixture delivered to the outer ring showerhead (at the edge of the wafer). Moreover, because the process gases which react with each other may be kept separate until they exit through the orifices in the dual showerheads, the deposition of unwanted particles within the process gas delivery tubes, showerhead manifolds, and the orifices may be reduced. The dual split showerhead 6002 may also enable the deposition of a PZT thin film having uniform wafer center-to-edge composition and thickness with an across wafer temperature tilt of about 10° C. or less. For larger diameter wafers, more showerheads with more segments may be used, such as triple split showerheads or quadruple split showerheads.

Additional embodiments showing separated dual showerheads 7002 and separated split dual showerheads 8002 are illustrated in FIG. 7 and FIG. 8, respectively. The outer ring and circular inner showerheads 7004, 7006 shown in FIG. 7 may be similar to the showerheads 5004, 5006 shown in FIG. 5; however the showerheads 7004, 7006 in FIG. 7 are physically separated by spaces 7010. Furthermore, the outer ring and circular inner showerheads 8004, 8006 shown in FIG. 8 may be similar to the showerheads 6004, 6006 shown in FIG. 6; however, the showerheads 8004, 8006 in FIG. 8 are physically separated by spaces 8010. In these embodiments, the outer ring showerheads 7004, 8004 are physically separated from the circular inner showerheads 7006, 8006. The space 7010, 8010 between the outer and inner showerheads may be filled with a dielectric material so that outer and inner showerheads may be powered or biased separately for PECVD. Alternatively or additionally, the space 7010, 8010 may be filled with a thermally insulating material so that the outer and inner shower heads may be maintained at different temperatures.

Various additional modifications are within the scope of the above embodiments. As an example, the deposition of a PZT thin film is discussed supra; however, other thin films may be deposited (such as barium strontium titanate).

While various embodiments have been described above, it should be understood that they have been presented by way of example only and not limitation. Numerous changes to the disclosed embodiments can be made in accordance with the disclosure herein without departing from the spirit or scope of the embodiments. Thus, the breadth and scope of the embodiments should not be limited by any of the above described embodiments. Rather, the scope of the embodiments should be defined in accordance with the following claims and their equivalents.

What is claimed is:

1. A process of depositing a CVD thin film, comprising:
    supplying a first process gas mixture to a circular inner showerhead through a first process gas delivery tube, where the individual gases in said first process gas mixture do not react with each other;
    supplying a second process gas mixture to said circular inner showerhead through a second process gas delivery tube;
    supplying a third process gas mixture to an outer ring showerhead through a third process gas delivery tube where said third process gas mixture is composed of the same process gasses as said first process gas mixture but where at least one process gas in said third process gas mixture has a different concentration than in said first process gas mixture;
    supplying a fourth process gas mixture to said outer ring showerhead through a fourth process gas delivery tube; and
    providing a wafer center-to-edge temperature gradient that is about 10° C. or less.

2. The process of claim 1 further comprising:
    supplying said first process gas mixture to a first gas distribution manifold;
    supplying said second process gas mixture to a second gas distribution manifold;
    supplying said third process gas mixture to a third gas distribution manifold; and
    supplying said fourth process gas mixture to a fourth gas distribution manifold.

3. The process of claim 1 where said first process gas mixture and said third process gas mixture includes gaseous lead organometallic, gaseous zirconium organometallic, and gaseous titanium organometallic, plus an inert carrier gas; and where said second process gas mixture and said fourth process gas mixture is oxygen.

4. The process of claim 3 where said first process gas mixture has a first ratio of lead/(zirconium+titanium) in the range of about 0.8 to 1.5, and where said third process gas mixture has a second ratio of lead/(zirconium+titanium) in the range of about 0.8 to 1.5.

5. The process of claim 4 where said first ratio is approximately 1.2 and where said second ratio is approximately 1.0.

6. The process of claim 1 where said first process gas mixture and said second process gas mixture includes barium organometallic, strontium organometallic, and titanium organometallic, plus an inert carrier gas; and where said second process gas mixture and said fourth process gas mixture is oxygen.

7. A process of depositing a CVD thin film in a CVD chamber, comprising:
    supplying a first process gas mixture containing a lead organometallic, a zirconium organometallic, a titanium organometallic and a carrier gas to a circular inner showerhead through a first process gas delivery tube;
    supplying oxygen to said circular inner showerhead through a second process gas delivery tube;
    supplying a third process gas mixture containing a lead organometallic, a zirconium organometallic, a titanium organometallic and a carrier gas to an outer ring showerhead through a third process gas delivery tube;
    supplying said oxygen to said outer ring showerhead through a fourth process gas delivery tube; and
    creating a temperature gradient of less than 10 degrees from center to an edge of a wafer in said CVD chamber.

8. The process of claim 7 further comprising:
    supplying said first process gas mixture to a first gas distribution manifold;
    supplying said oxygen to a second gas distribution manifold;
    supplying said third process gas mixture to a third gas distribution manifold; and
    supplying said oxygen to a fourth gas distribution manifold.

9. The process of claim 8 where said first process gas mixture has a first ratio of lead/(zirconium+titanium) in the range of about 0.8 to 1.5, and where said third process gas mixture has a second ratio of lead/(zirconium+titanium) in the range of about 0.8 to 1.5.

* * * * *